(12) United States Patent
Lee

(10) Patent No.: US 8,237,439 B2
(45) Date of Patent: Aug. 7, 2012

(54) COMPOSITE PULSE DESIGN METHOD FOR LARGE-TIP-ANGLE EXCITATION IN HIGH FIELD MAGNETIC RESONANCE IMAGING

(75) Inventor: Seung-Kyun Lee, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 453 days.

(21) Appl. No.: 12/540,411

(22) Filed: Aug. 13, 2009

(65) Prior Publication Data

US 2011/0037465 A1 Feb. 17, 2011

(51) Int. Cl.
*G01V 3/00* (2006.01)
(52) U.S. Cl. ............ 324/309; 324/307; 600/410
(58) Field of Classification Search ........... 324/309, 324/307, 306; 600/410
See application file for complete search history.

(56) References Cited

U.S. PATENT DOCUMENTS

| | | | |
|---|---|---|---|
| 5,105,152 A | 4/1992 | Pauly | |
| 6,252,399 B1 | 6/2001 | Pruessmann et al. | |
| 6,285,900 B1 * | 9/2001 | Stuber et al. | 600/410 |
| 6,750,649 B1 * | 6/2004 | Rosenfeld | 324/307 |
| 7,368,910 B2 * | 5/2008 | Bammer et al. | 324/306 |
| 7,466,131 B1 | 12/2008 | Xu et al. | |
| 7,683,618 B2 * | 3/2010 | Balchandani et al. | 324/309 |
| 2005/0110488 A1 | 5/2005 | Zhu | |
| 2009/0021254 A1 | 1/2009 | Gore et al. | |

OTHER PUBLICATIONS

Klaas P. Pruessmann, Xavier Golay, Matthias Stuber, Markus B. Scheidegger, and Peter Boesiger; "RF Pulse Concatenation for Spatially Selective Inversion"; Journal of Magnetic Resonance 146, 58-65 (2000).
Y. Pang, G.X. Shen ; "Improving excitation and inversion accuracy by optimized RF pulse using genetic algorithm"; Journal of Magnetic Resonance 186 (2007) 86-93.
William Allyn Grissom; "RF pulse design for parallel excitation in MRI"; 131 Pages.
Marina Piccinelli, Alessandro Veneziani, David A. Steinman, Andrea Remuzzi and Luca Antiga; "A framework for geometric analysis of vascular structures: application to cerebral aneurysms"; IEEE Transactions on Medical Imaging, vol. X, No. X, Month 2009; 15 Pages.

* cited by examiner

*Primary Examiner* — Louis Arana
(74) *Attorney, Agent, or Firm* — Ann M. Agosti

(57) ABSTRACT

A magnetic resonance imaging apparatus having a static magnetic field source, a plurality of radio frequency magnetic field sources and a plurality of gradient magnetic field sources for generating a gradient magnetic field is provided. The static magnetic field source generates a static magnetic field for aligning a spin vector of an object in a direction of the magnetic field and plurality of radio frequency magnetic field sources generate a radio frequency magnetic field for rotating the spin vector by an angle. The apparatus further includes a processor for generating a plurality of radio frequency excitation pulses for the plurality of radio frequency magnetic field sources and a plurality of gradient excitation pulses for the plurality of gradient magnetic field sources. The second half of each of the plurality of radio frequency excitation pulses comprises a time-reversed first half of a respective one of the plurality of radio frequency excitation pulses and the second half of each of the plurality of gradient excitation comprises a time-reversed and sign-reversed first half of a respective one of the plurality of gradient excitation pulses. The average value of each of the plurality of gradient excitation pulses is zero.

21 Claims, 4 Drawing Sheets

COMPOSITE PULSE DESIGN METHOD FOR LARGE-TIP-ANGLE EXCITATION IN HIGH FIELD MAGNETIC RESONANCE IMAGING

STATEMENT REGARDING FEDERALLY SPONSORED RESEARCH & DEVELOPMENT

This invention was made with government support under 5R01EB005307-2 awarded by National Institutes of Health. The government has certain rights in the invention.

BACKGROUND

The invention relates generally to a magnetic resonance imaging (MRI) system and more specifically to generation of radio frequency (RF) pulses for large tip angle excitation and spin refocusing.

MRI is an imaging technique used primarily in medical settings to produce high quality images of the inside of the human body. In a MRI system nuclear magnetic moments of a portion of the body or other object to be measured are excited at specific spin precession frequencies, which are proportional to the local magnetic field. The radio-frequency signals resulting from the precession of these of signals is provided representing different regions of the volume. These are combined to produce a volumetric image of the nuclear spin density of the body.

Briefly, a strong static magnetic field is employed to line up atoms whose nuclei have an odd number of protons and/or neutrons that have spin angular momentum and a magnetic dipole moment. A second RF magnetic field, applied as a single pulse transverse to the first, is then used to pump energy into these nuclei, flipping them over, for example to 90° or 180°. After excitation the nuclei gradually return to alignment with the static field and give up the energy in the form of weak but detectable free induction decay (FID). These FID signals are used by a computer to produce images.

The RF magnetic field is generally produced by applying RF pulses to RF coils. In some circumstances, the generated RF magnetic field may not provide accurate spin or rotation of nuclei, for e.g., 75° for a desired spin of 90°. Various RF pulse generation techniques have been utilized to correct for these spin errors. These techniques focus on numerical, iterative corrections to an initial RF pulse which itself is obtained from linear approximation to Bloch equations. However, such corrections usually take significant amount of design time and/or computer resources and are dependent upon the initial estimation. Therefore, it is desirable to determine a method and a system that will address the design time and accuracy of the pulses.

BRIEF DESCRIPTION

In accordance with an embodiment of the present invention, a magnetic resonance imaging apparatus is provided. The apparatus comprises a static magnetic field source for generating a static magnetic field for aligning a spin vector of an object in a direction of the magnetic field. The apparatus further comprises a plurality of radio frequency magnetic field sources for generating a radio frequency magnetic field for rotating the spin vector by an angle and a plurality of gradient magnetic field sources for generating a gradient magnetic field. The apparatus also includes a processor for generating a plurality of radio frequency excitation pulses for the plurality of radio frequency magnetic field sources and a plurality of gradient excitation pulses for the plurality of gradient magnetic field sources, wherein a second half of each of the plurality of radio frequency excitation pulses comprises a time-reversed first half of a respective one of the plurality of radio frequency excitation pulses. A second half of each of the plurality of gradient excitation comprises a time-reversed and sign-reversed first half of a respective one of the plurality of gradient excitation pulses and the average value of each of the plurality of gradient excitation pulses is zero.

In accordance with another exemplary embodiment of the present invention, a method of generating an excitation for a magnetic resonance imaging apparatus is provided. The method includes defining a first half of each of a plurality of gradient excitation pulses and a first half of each of a plurality of radio frequency excitation pulses. The method also includes defining a second half of each of the plurality of gradient excitation pulses by time-reversing a first half a respective one of the plurality of gradient excitation pulses and further sign-reversing the time-reversed pulse, wherein the average value of the plurality of gradient excitation pulses is zero. The method further includes defining a second half of each of the plurality of radio frequency excitation pulses by time-reversing a first half of a respective one of the plurality of radio frequency excitation pulses. Further, the plurality of radio frequency excitation pulses are generated by concatenating the first and second halves of respective pairs of the plurality of gradient excitation pulses and applying the plurality of gradient excitation pulses to a plurality of gradient coils. The plurality of radio frequency excitation pulses are generated by concatenating the first and second halves of respective pairs of the plurality of radio frequency excitation pulses and applying the plurality of radio frequency excitation pulses to a plurality of radio frequency coils.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
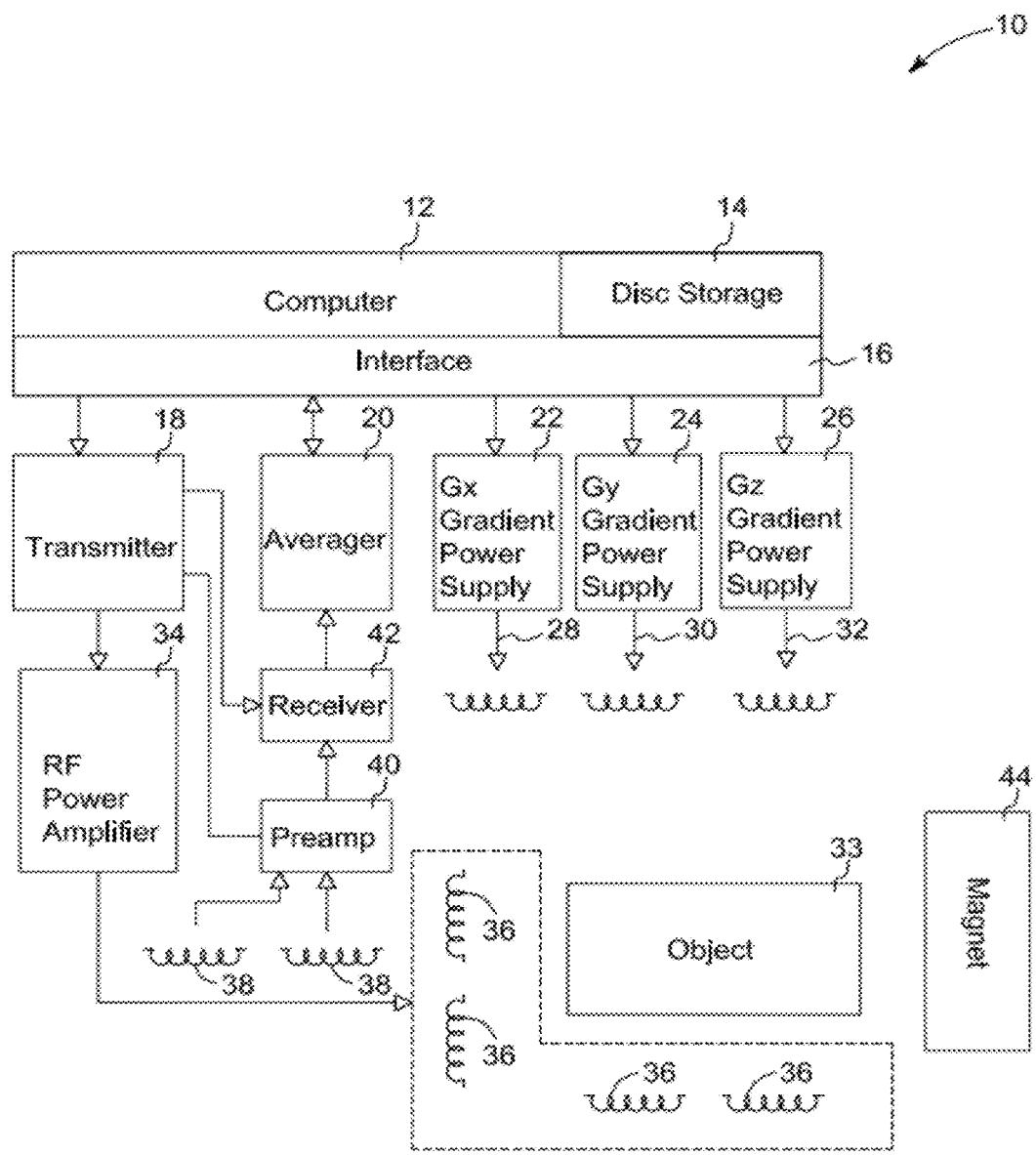
FIG. 1 is a diagrammatical representation of an MR imaging system for use with embodiment of the present invention.

FIG. 1 is a simplified block diagram of the major components of an MRI system 10 that may incorporate embodiments of the present invention. The system 10 comprises a computer 12 which is functionally coupled to a disk storage unit 14 and an interface unit 16 and in one embodiment comprises a general purpose computer, for example. The system 10 further includes a RF transmitter 18, a signal averager 20 and gradient power supplies 22, 24 and 26 for energizing, respectively, x, y, z gradient coils 28, 30 and 32. The gradient power supplies are also coupled to computer 12 through interface unit 16.

The RF transmitter 18 is gated with pulse envelopes from computer 12 to generate RF pulses having the required modulation to excite resonance in the object 33 under study. The RF pulses are amplified in RF power amplifier 34 to levels varying from 100 watts to several kilowatts, depending on the imaging method, and applied to a plurality of transmitter RF coils 36. The higher power levels are necessary for large sample volumes such as in whole body imaging and where short duration pulses are required to excite large MR frequency bandwidths.

The MR signal is sensed by receiver RF coil 38, amplified in a low noise preamplifier 40 and applied for further amplification, detection and filtering to receiver 42. In one embodiment, a plurality of receiver RF coils 38 may be used simultaneously with the transmitter RF coils 36. The signal is then digitized for averaging by signal averager 20 and for processing by computer 12. Preamplifier 40 and receiver 42 are protected from the RF pulses during transmission by active gating or by passive filtering, for example.

The computer 12 provides gating and envelope modulation for the MR pulses described herein, blanking for preamplifier 40 and RF power amplifier 34 and voltage waveforms for the gradient power supplies 22, 24, 26. The computer also performs data processing such as Fourier transforms, image reconstruction, data filtering, imaging display, and storage functions, all of which are operations conventionally performed by minicomputers and hence described herein only functionally.

The transmitter and receiver RF coils, if desired, may comprise a single coil. Alternatively, two separate coils that are electrically orthogonal may be used. The latter configuration has the advantage of reduced RF pulse breakthrough into the receiver during pulse transmission. In both cases, the fields of the coils are orthogonal to the direction of the static magnetic field produced by a magnet 44. In one embodiment, a plurality of transmitter RF coils 36 may be used and a plurality of RF pulses are applied to each of the transmitter RF coils. The plurality of transmitter RF coils 36 are arranged around the object 33 for parallel transmission. In one embodiment, the arrangement of the RF coils may be a linear arrangement or honey-comb type arrangement. The advantage of having a plurality of transmitter RF coils is to have better control of spatial distribution of the excited spins, such as cylindrical shape, with less RF power and with shorter RF pulse duration than obtained with a single RF coil. The transmitter and receiver RF coils are isolated from the remainder of the system by enclosure in an RF shielded cage. In one embodiment, the frequency of the RF pulses is in the range of 10 Hz to 10 GHz. Magnetic field gradient coils 28, 30 and 32 are necessary to provide gradients Gx, Gy and Gz respectively. In one embodiment, the gradient coils and RF coils are energized simultaneously. In another embodiment, all three gradient coils are energized simultaneously to create a three dimensional gradient magnetic field.

In operation, the magnet 44 produces a static magnetic field to align magnetization of protons of the body cells in the direction of the static magnetic field that is generated. The RF coils produce a RF magnetic field for rotating the spin vector by a desired angle. When the RF field is turned off, the protons return to the original magnetization alignment. These alignment changes create MR signals, which are detected by the receiver coil 38. The frequency of the emitted signal depends on the strength of the magnetic field. The position of protons in the body can be determined by applying additional magnetic fields during the scan, and the image of the body may thus be built up. The gradient coils, when energized, create these additional magnetic fields.

The MR signals picked up by the receiver coil 38 are digitized by the receiver 42 and the averager 20 and transferred to the computer 12. A scan is complete when an array of raw k-space data has been acquired in the disk storage 14. This raw k-space data is rearranged into separate k-space data arrays for each image to be reconstructed, and then the computer 12 operates transform the data into an array of image data.

In one embodiment, the RF pulse comprises a composite excitation pulse in which excitation errors in the first half of the RF pulse are corrected by the second half of the RF pulse. The first half of the RF pulse and the second half of the RF pulse are concatenated to form the composite pulse. In another embodiment, the composite pulse includes a set of RF pulses for each of the RF coils used for MRI transmission. The RF pulses are applied to the object or the body in synchrony with a designated gradient pulse to cover an appropriate excitation k-space of the object. As will be appreciated by those skilled in the art, the k-space is a temporary image space in which data from digitized MR signals are stored during data acquisition.

Figure 2:
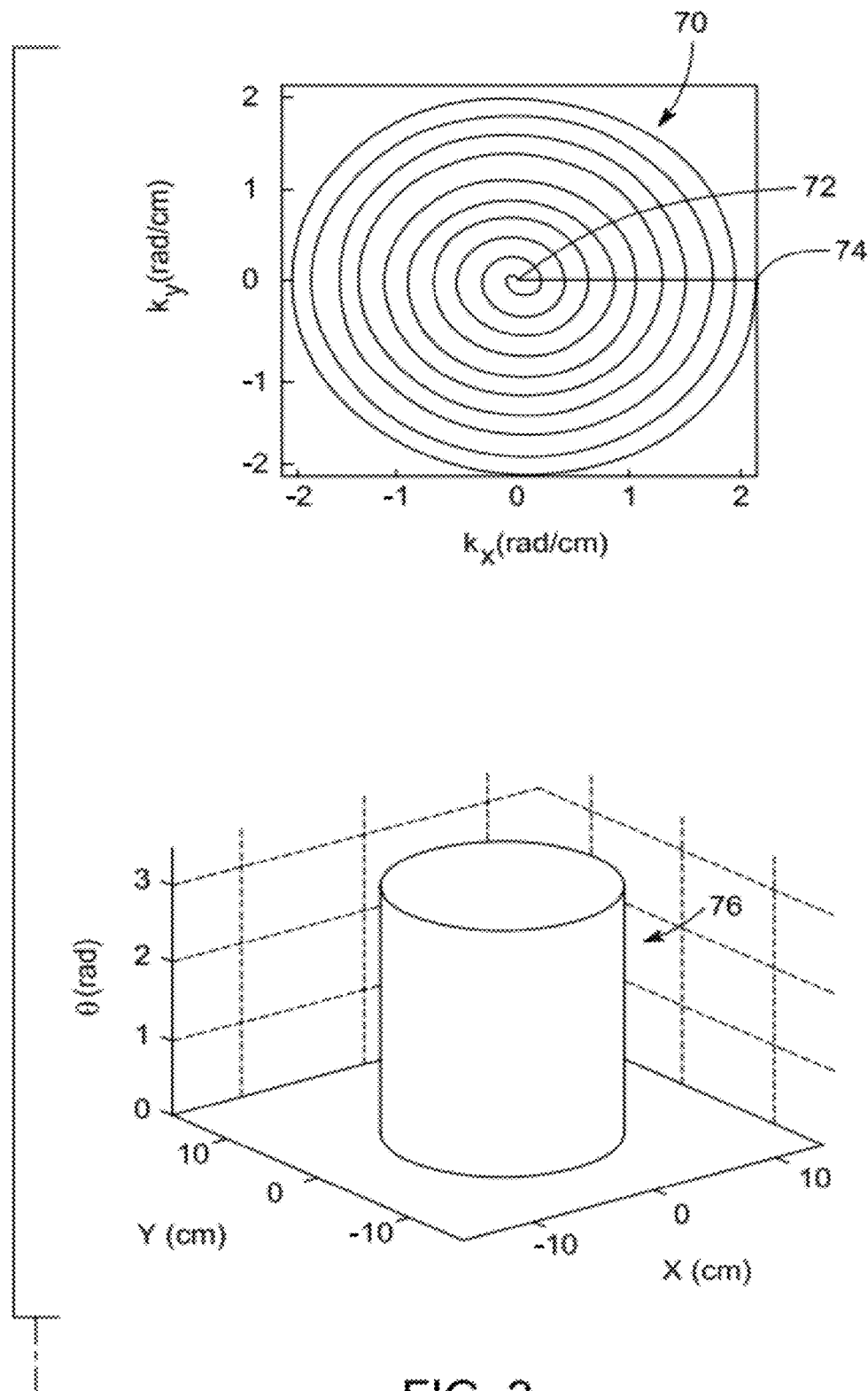
FIG. 2 is a graph of 2-D spiral k-space trajectory.

FIG. 2 depicts one example of a spiral excitation k-space trajectory 70 for a cylindrically shaped flip angle profile 76. For example, trajectory 70 of FIG. 2 may be used for a 2 D spatially selective 180 degree refocusing pulse to acquire a spin echo. The trajectory 70 can be traversed either inward or outward. For an inward traversal, trajectory 70 begins at an origin 72 of the k-space, move to a periphery 74 of k-space, and then spiral inward to return to origin. On the other hand, outward traversal simply reverses this movement. The speed of the movement is determined in part by the ability to change gradient fields quickly and maximum allowable RF power deposited to the object. In one embodiment, for inward spiral or in a clockwise direction, the RF power or RF pulses are generally concentrated toward the end of the trajectory because the required RF power is greater for small k values. Therefore, a composite pulse employing first an inward spiral followed by an outward spiral has overall RF power concentrated near the center of the total pulse. The advantage of concentrated RF power compared to distributed peak RF power is that it increases the RF pulse bandwidth, and makes the pulse less sensitive to unwanted local variation of static magnetic field in the object. In another embodiment, for outward spiral or in counterclockwise direction, the RF power or RF pulses are generally concentrated or positioned toward the beginning.

Figure 3:
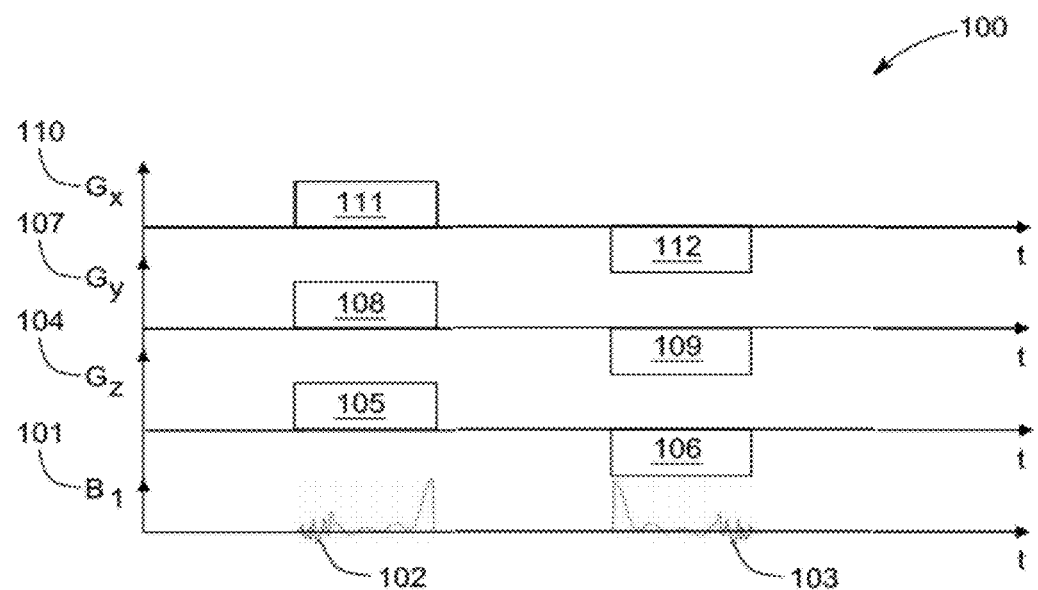
FIG. 3 is an example of a composite radio-frequency (RF) pulse for large-tip-angle spin vector excitation or inversion in accordance with an embodiment of the present invention.

FIG. 3 shows an example 100 of a composite pulse and corresponding gradient pulses for spin vector inversion. The composite RF pulse 101 includes concatenation of first RF pulse 102 and second RF pulse 103. The separation between the two pulses can be zero to a few milliseconds. In one embodiment, the separation should be as small as possible to achieve maximum insensitivity to unwanted local magnetic field variation. The first RF pulse is designed by using one of many existing conventional methods to produce half of the excitation. This includes small-tip-angle linearization method and iterative method. As can be seen in FIG. 3, the second RF pulse in one embodiment is obtained by time reversing the first RF pulse. For example, if the phase and the amplitude of first RF pulse are given by complex function $B_1(t)$ then the second RF pulse $B_2(t)$ may be given by following equation:

$$B_2(t) = B_1(T-t) \tag{1}$$

where, T is the time period and t is the real time.

The composite pulse designed by concatenation of the first and second RF pulses is robust against design errors. In one embodiment, multiple such composite pulses are applied to the RF coil in a synchronous manner with respect to the three gradient pulses 104, 107 and 110. Applying three gradient pulses simultaneously to the three gradient coils produces a three dimensional gradient magnetic field and thus results in better resolution of the image that is produced. It should be noted that, in another embodiment, one dimensional and two dimensional gradient magnetic fields may also be used. Each of the gradient pulses 104, 107 and 110 comprise a first gradient pulses 105, 108, 111 and second gradient pulses 106, 109, 112. The second gradient pulse G2(t) may be given by:

$$G_2(t) = -G_1(T-t) \quad (2)$$

where, $G_1(t)$ is first gradient pulse. Thus, second gradient pulses are obtained by time reversing and sign reversing first gradient pulses. The shapes of the gradient pulses are not in general rectangular, but determined to effectively cover the k-space such as shown in FIG. 2. In this example, another gradient pulse (not shown) is applied to the gradient coil after the excitation pulse, in order to obtain a complete set of measured MR signals such that the k-space is scanned along a plurality of parallel lines, which are regularly distributed in the k-space.

Figure 4:
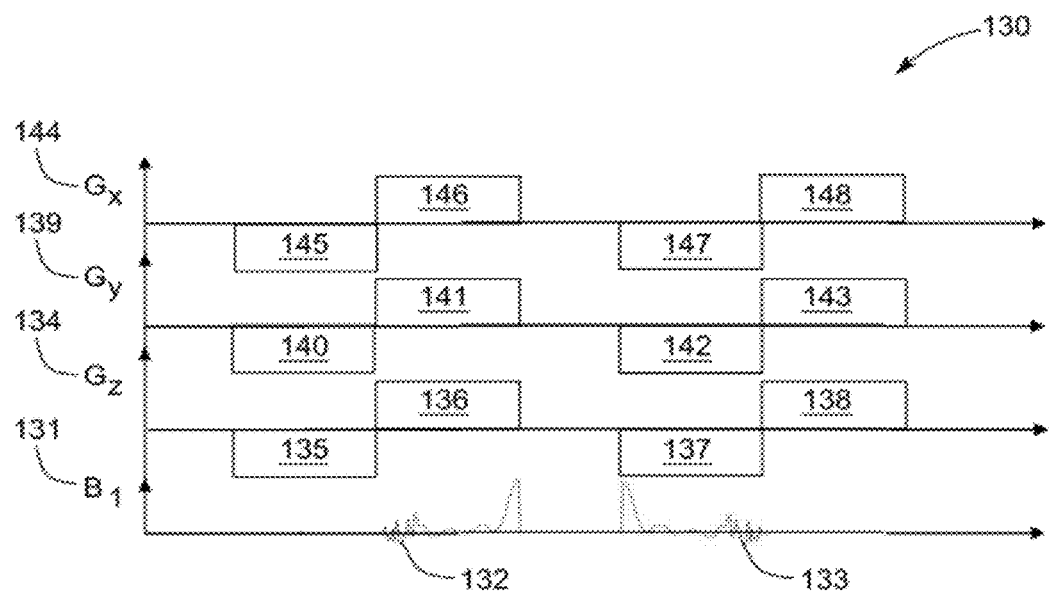
FIG. 4 is an example of a composite RF pulse for spin vector refocusing in accordance with an embodiment of the present invention.

FIG. 4 shows an example 130 of a composite RF pulse 131 and corresponding gradient pulses 134, 139 and 144 for spin vector refocusing. Similar to the example of FIG. 3, the second RF pulse 133 is obtained by time reversing the first RF pulse 132 and second gradient pulses 137, 142, 147 are obtained by time reversing and sign reversing the first gradient pulses 136, 141, 146. However, in this refocusing example, phase-correction gradients 138, 143, 148 are applied after the second gradient pulses 137, 142, 147, and phase-preparation gradients 135, 140, 145 are applied before the first gradient pulses 136, 141, 146. The two additional gradients ensure that the average value of each of the plurality of gradient excitation pulses is zero.

Figure 5:
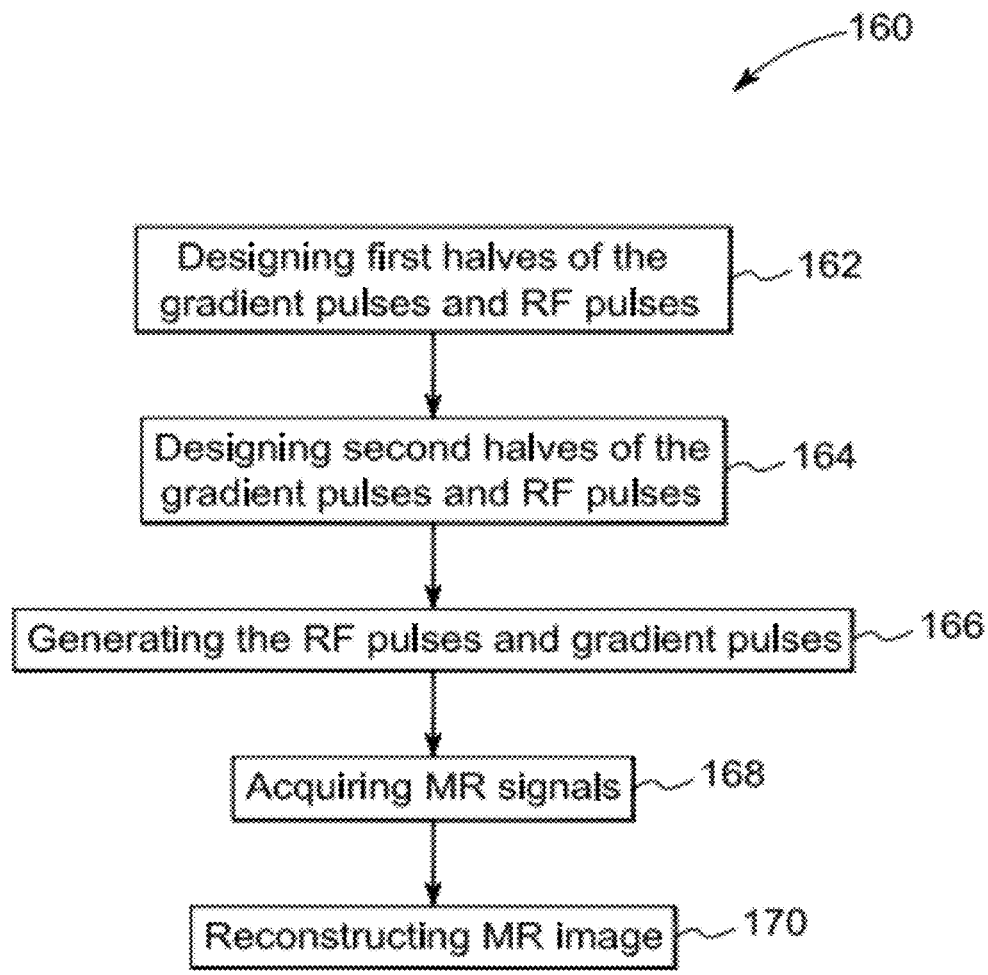
FIG. 5 is a flow chart representing steps of generating a large tip angle excitation for a MRI apparatus in accordance with an embodiment of the present invention.

FIG. 5 is a flow chart representing steps in an exemplary method 160 of generating a large tip angle excitation for a MRI apparatus. In step 162 of the method, first halves and second halves of the RF pulse and gradient pulses are designed by conventional methods to obtain roughly uniform 1-theta excitation in the object. In step 164, second halves of the RF pulse and gradient pulses are designed. The second half of the RF pulse is obtained by time reversing the first half of the RF pulse. The second half of the gradient pulse is obtained by time reversing and sign reversing the first half of the gradient pulses. Time reversal and sign reversal of the first half of the gradient pulse is obtained by reversing the k-space trajectory. For example, if the first half of the gradient pulse was obtained by traversing the k-space in a clockwise direction then to obtain the second half of the gradient pulse the k-space is traversed in counterclockwise direction. In step 166, the RF pulses and gradient pulses are generated by concatenating the first half and the second half of the respective pulses. Thus, the errors in the first half of the RF pulse is corrected by the addition of the second half of the RF pulse. In step 168, the MR signals are acquired by a receiver coil of the MRI apparatus and transmitted to the processor. The processor reconstructs the MI image from the MR signals at step 170.

The advantages of the proposed method are shorter pulse design time and high quality RF pulse allowing real time correction for the patient-specific RF distortion in MRI sessions. The reliable and robust RF pulse performance leads to high quality MR images with high contrast fidelity and uniform image intensity.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A magnetic resonance imaging apparatus comprising:
   a static magnetic field source for generating a static magnetic field for aligning a spin vector of an object in a direction of the magnetic field;
   a plurality of radio frequency magnetic field sources for generating a radio frequency magnetic field for rotating the spin vector by an angle;
   a plurality of gradient magnetic field sources for generating a gradient magnetic field;
   a processor for generating a plurality of radio frequency excitation pulses for the plurality of radio frequency magnetic field sources and a plurality of simultaneous gradient excitation pulses for the plurality of gradient magnetic field sources,
   wherein a second half of each of the plurality of radio frequency excitation pulses comprises a time-reversed first half of a respective one of the plurality of radio frequency excitation pulses,
   wherein a second half of each of the plurality of gradient excitation comprises a time-reversed and sign-reversed first half of a respective one of the plurality of gradient excitation pulses, and
   wherein the average value of each of the plurality of gradient excitation pulses is zero.

2. The apparatus of claim 1, wherein the static magnetic field source comprises a permanent magnet or an electromagnet.

3. The apparatus of claim 1, further comprising a plurality of radio frequency magnetic field receivers configured to obtain MR signals from the object, and wherein the processor is configured to receive the MR signals.

4. The apparatus of claim 1, wherein the processor is configured to determine a k-space excitation trajectory for generating the first halves of each of the gradient excitation pulses.

5. The apparatus of claim 4, wherein the k-space excitation trajectory comprises large-tip-angle excitation trajectory, inversion trajectory or refocusing trajectory.

6. The apparatus of claim 1, wherein the first half of the RF pulse produces one-half of a spin excitation.

7. The apparatus of claim 6, wherein the spin excitation comprises 90° excitation.

8. The apparatus of claim 1, wherein the plurality of gradient magnetic field sources produces a three dimensional gradient magnetic field.

9. The apparatus of claim 1, wherein the plurality of RF magnetic field sources are linearly arranged around the object.

10. The apparatus of claim 1, wherein the frequency of the plurality of RF pulses is in the range of 10 Hz to 100 GHz.

11. The apparatus of claim 1, wherein the processor is further configured to generate phase preparation gradient pulses before and phase correction gradient pulses after the first and second halves of the plurality of gradient pulses respectively.

12. A method of generating an excitation for a magnetic resonance imaging apparatus comprising the steps of:
   defining a first half of each of a plurality of gradient excitation pulses and a first half of each of a plurality of radio frequency excitation pulses;
   defining a second half of each of the plurality of gradient excitation pulses by time-reversing a first half of a respective one of the plurality of gradient excitation pulses and further sign-reversing the time-reversed pulse, wherein the average value of the plurality of gradient excitation pulses is zero;

defining a second half of each of the plurality of radio frequency excitation pulses by time-reversing a first half of a respective one of the plurality of radio frequency excitation pulses;

generating the plurality of gradient excitation pulses simultaneously by concatenating the first and second halves of respective pairs of the plurality of gradient excitation pulses and applying the plurality of gradient excitation pulses to a plurality of gradient coils; and generating the plurality of radio frequency excitation pulses by concatenating the first and second halves of respective pairs of the plurality of radio frequency excitation pulses and applying the plurality of radio frequency excitation pulses to a plurality of radio frequency coils.

13. The method of claim 12, wherein the excitation comprises large tip angle excitation, inversion or refocusing.

14. The method of claim 12, wherein generating the plurality of gradient excitation pulses comprises applying phase preparation gradient pulses before and phase correction gradient pulses after the first and second halves of the plurality of gradient pulses respectively.

15. The method of claim 12, wherein generating the plurality of first halves of the gradient pulses comprises determining a k-space excitation trajectory.

16. The method of claim 15, wherein generating the plurality of first halves of the gradient pulses comprises traversing the k-space trajectory.

17. The method of claim 16, wherein generating the plurality of first halves of the gradient pulses further comprises positioning the radio frequency pulses at the end of the k-space trajectory.

18. The method of claim 15, wherein traversing the k-space trajectory comprises traversing the k-space trajectory in an inward direction or an outward direction.

19. The method of claim 15, wherein generating the plurality of second halves of the gradient pulses comprises traversing the k-space trajectory.

20. The method of claim 19, wherein generating the plurality of second halves of the gradient pulses further comprises positioning the radio frequency pulses at the beginning of the trajectory.

21. The method of claim 19, wherein traversing the k-space trajectory comprises traversing the k-space in a counterclockwise direction.

* * * * *